United States Patent
Li et al.

(10) Patent No.: US 11,942,405 B2
(45) Date of Patent: Mar. 26, 2024

(54) SEMICONDUCTOR PACKAGE ASSEMBLY USING A PASSIVE DEVICE AS A STANDOFF

(71) Applicant: ATI TECHNOLOGIES ULC, Markham (CA)

(72) Inventors: Jianguo Li, Markham (CA); Roden Topacio, Markham (CA)

(73) Assignee: ATI TECHNOLOGIES ULC, Markham (CA)

(*) Notice: Subject to any disclaimer, the term of this patent is extended or adjusted under 35 U.S.C. 154(b) by 147 days.

(21) Appl. No.: 17/525,424

(22) Filed: Nov. 12, 2021

(65) Prior Publication Data

US 2023/0154834 A1    May 18, 2023

(51) Int. Cl.
*H01L 25/16* (2023.01)
*H01L 23/31* (2006.01)
*H01L 23/498* (2006.01)
*H01L 23/50* (2006.01)
*H01L 23/64* (2006.01)

(52) U.S. Cl.
CPC .. *H01L 23/49816* (2013.01); *H01L 23/49833* (2013.01); *H01L 23/49838* (2013.01); *H01L 23/642* (2013.01); *H01L 23/645* (2013.01); *H01L 23/647* (2013.01); *H01L 25/16* (2013.01)

(58) Field of Classification Search
CPC ........... H01L 23/3128; H01L 23/49816; H01L 23/49827; H01L 23/49838; H01L 23/50; H01L 23/642; H01L 23/645; H01L 23/647; H01L 24/17; H01L 25/16; H01L 25/50

See application file for complete search history.

(56) References Cited

U.S. PATENT DOCUMENTS

| | | | |
|---|---|---|---|
| 6,841,842 B2* | 1/2005 | Li | H01L 31/12 257/431 |
| 10,629,507 B1* | 4/2020 | Li | H01L 23/5386 |
| 2006/0145339 A1* | 7/2006 | Yang | H01L 24/32 257/E23.125 |
| 2009/0267220 A1* | 10/2009 | Kuhlman | H01L 25/16 438/118 |
| 2014/0252544 A1* | 9/2014 | Li | H01L 23/50 257/532 |
| 2018/0005957 A1* | 1/2018 | Vincent | H01L 23/49838 |
| 2018/0145033 A1* | 5/2018 | Yi | H01L 23/5384 |
| 2019/0131258 A1* | 5/2019 | Sakai | H01L 23/49822 |
| 2020/0020653 A1* | 1/2020 | Lim | H01L 23/552 |
| 2022/0071013 A1* | 3/2022 | Morrison | H01L 28/40 |

* cited by examiner

*Primary Examiner* — Omar F Mojaddedi (57) ABSTRACT

A semiconductor package assembly includes a semiconductor package that includes a semiconductor chip bonded to a substrate. The assembly also includes a plurality of passive devices mounted on a bottom surface of the substrate opposite the semiconductor chip, the plurality of passive devices including a plurality of operable passive devices and a plurality of standoff passive devices, wherein a height of each of the plurality of standoff passive devices is greater than a height of any of the plurality of operable passive devices. The assembly also includes a plurality of solder structures attached to the bottom surface of the substrate. When mounted on a circuit board, the standoff passive devices prevent solder bridging.

19 Claims, 8 Drawing Sheets

```
┌─────────────────────────────────────────────────────────────┐
│ Provide A Semiconductor Package Including A Semiconductor   │
│ Chip Bonded To A Substrate 810                              │
└─────────────────────────────────────────────────────────────┘
                              │
                              ▼
┌─────────────────────────────────────────────────────────────┐
│ Mount A Plurality Of Passive Devices On A Bottom Surface Of │
│ The Substrate Opposite The Semiconductor Chip, The Plurality│
│ Of Passive Devices Including A Plurality Of Operable Passive│
│ Devices And A Plurality Of Standoff Passive Devices, Wherein│
│ A Height Of Each Of The Plurality Of Standoff Passive       │
│ Devices Is Greater Than A Height Of Any Of The Plurality Of │
│ Operable Passive Devices 820                                │
│                                                             │
│  ┌───────────────────────────────────────────────────────┐  │
│  │ Bond The Plurality Of Operable Passive Devices To A   │  │
│  │ First Plurality Of Interconnect Pads, Wherein The     │  │
│  │ First Plurality Of Interconnect Pads Are Electrically │  │
│  │ Coupled To The Semiconductor Chip Through Conductive  │  │
│  │ Structures In The Substrate 910                       │  │
│  └───────────────────────────────────────────────────────┘  │
│                              │                              │
│                              ▼                              │
│  ┌───────────────────────────────────────────────────────┐  │
│  │ Bond The Plurality Of Standoff Passive Devices To A   │  │
│  │ Second Plurality Of Interconnect Pads, Wherein The    │  │
│  │ Second Plurality Of Interconnect Pads Are Electrically│  │
│  │ Isolated From The Semiconductor Chip 920              │  │
│  └───────────────────────────────────────────────────────┘  │
└─────────────────────────────────────────────────────────────┘
                              │
                              ▼
┌─────────────────────────────────────────────────────────────┐
│ Attach A Plurality Of Solder Structures To The Bottom       │
│ Surface Of The Substrate 830                                │
└─────────────────────────────────────────────────────────────┘
```

SEMICONDUCTOR PACKAGE ASSEMBLY USING A PASSIVE DEVICE AS A STANDOFF

BACKGROUND

The semiconductor industry has experienced technological advances that have permitted dramatic increases in circuit density and complexity as well as dramatic decreases in power consumption and package sizes. As the demand for high-density semiconductor devices has increased, so has the demand for more external electrical connections on the exterior of the semiconductor packages. Such external interconnects connect the packaged device to external systems, such as a printed circuit board. To increase the number electrical connections available for the semiconductor device, and to address other problems, various chip packaging techniques have been developed. In one of these techniques, a package includes a semiconductor die bonded to a substrate. Interconnects of the semiconductor die are bonded to bond pads on an inner surface of the substrate, which includes traces and vias that fan-out to terminals on an outer surface of the substrate. These output terminals of the package, which are sometimes ball-shaped conductive bump contacts, are typically disposed in a rectangular array. These packages are occasionally referred to as 'ball grid array' (BGA) packages.

DETAILED DESCRIPTION

Printed circuit boards are employed in the electronic industry for the placement and interconnection of semiconductor circuitry. This circuitry can comprise microprocessor or digital signal processor circuitry in packages requiring many pinouts to connect to the printed circuit board. For example, a ball-grid array (BGA) package can be used for such circuitry. These BGA packages are typically electrically connected to a printed circuit board by a surface mounting technique, such as a solder reflow operation. The BGA package in particular cases some manufacturing difficulty as the solder connections from the printed circuit board to the BGA pinouts are directly beneath the BGA package. Moreover, the density of these connections can require a very small pitch between connections, which can result in solder bridging that electrically shorts connections.

Solder bridging is an unintended electrical connection between two conductors by means of a small blob of solder. In semiconductor packaging and board assembly, solder bridging between a semiconductor package and board solder joint is a major concern. Warpage of the semiconductor package and/or the board increases the risk of solder bridging of the solder joint between the die to package or package to board. In one technique, a standoff component can be attached to the package or to the board to maintain a minimum distance between the package and the board. However, the addition of such a component adds an extra process step to an assembly process. In another technique, special solder balls that include a copper or resin core can be employed to prevent solder ball collapse. However, this also adds an extra process step to the assembly process.

To that end, various methods of fabricating a semiconductor package are disclosed in this specification. In some implementations, a method of fabricating a semiconductor package assembly using a passive device as a standoff, includes providing a semiconductor package including a semiconductor chip bonded to a substrate. The method also includes mounting a plurality of passive devices on a bottom surface of the substrate opposite the semiconductor chip. The plurality of passive devices includes a plurality of operable passive devices and a plurality of standoff passive devices, where a height of each of the plurality of standoff passive devices is greater than a height of any of the plurality of operable passive devices. The method also includes attaching a plurality of solder structures to the bottom surface of the substrate. In some examples, the height of each of the plurality of standoff passive devices is less than a height of the plurality of solder structures. The plurality of standoff passive devices can include a capacitor, a resistor, or an inductor.

In some implementations, mounting the plurality of passive devices on the bottom surface of the substrate opposite the semiconductor chip includes bonding the plurality of operable passive devices to a first plurality of interconnect pads, where the first plurality of interconnect pads is electrically coupled to the semiconductor chip through conductive structures in the substrate. These implementations further include bonding the plurality of standoff passive devices to a second plurality of interconnect pads, where the second plurality of interconnect pads are electrically isolated from the semiconductor chip. In some variations, the second plurality of interconnect pads are not electrically coupled to any conductive structures in the substrate. In other variations, the second plurality of interconnect pads are coupled to ground.

In some implementations, the method also includes mounting the semiconductor package on a circuit board and performing a solder reflow in which the solder structures compress such that a surface of at least one standoff passive device contacts the circuit board.

Also described in this specification are implementations of a semiconductor package assembly that includes a semiconductor package. The semiconductor package includes a semiconductor chip bonded to a substrate. The semiconductor package assembly also includes a plurality of passive devices mounted on a bottom surface of the substrate opposite the semiconductor chip. The plurality of passive devices includes a plurality of operable passive devices and a plurality of standoff passive devices, where a height of each of the plurality of standoff passive devices is greater than a height of any of the plurality of operable passive devices. The semiconductor package assembly also includes a plurality of solder structures attached to the bottom surface of the substrate. In some examples, the height of each of the plurality of standoff passive devices is less than a height of the plurality of solder structures. In some examples, the plurality of standoff passive devices a capacitor, a resistor, or an inductor.

In some implementations, the substrate includes a first plurality of interconnect pads electrically coupled to the semiconductor chip through conductive structures in the substrate, where the plurality of operable passive devices is bonded to the first plurality of interconnect pads. In these implementations, the substrate also includes a second plurality of interconnect pads electrically isolated from the semiconductor chip, where the plurality of standoff passive devices are bonded to the second plurality of interconnect pads. In some variations, the second plurality of interconnect pads are not electrically coupled to any conductive structures in the substrate. In other variations, the second plurality of interconnect pads are coupled to ground.

Another variation of the embodiment is directed to an apparatus that includes a circuit board and a semiconductor package coupled to the circuit board by solder structures. The semiconductor package includes a semiconductor chip bonded to a substrate, a plurality of passive devices mounted on a bottom surface of the substrate between the substrate and the circuit board, where the plurality of passive devices includes a plurality of operable passive devices, and a plurality of standoff passive devices, where a height of each of the plurality of standoff passive devices is greater than a height of any of the plurality of operable passive devices. In some examples, the height of each of the plurality of standoff passive devices is less than a height of the plurality of solder structures.

In some implementations, the substrate includes a first plurality of interconnect pads electrically coupled to the semiconductor chip through conductive structures in the substrate. The plurality of operable passive devices is bonded to the first plurality of interconnect pads. In these implementations, the substrate also includes a second plurality of interconnect pads electrically isolated from the semiconductor chip. The plurality of standoff passive devices are bonded to the second plurality of interconnect pads. In some variations, the second plurality of interconnect pads are not electrically coupled to any conductive structures in the substrate. In other variations, the second plurality of interconnect pads are coupled to ground.

In some implementations, at least one of the plurality of standoff passive devices contacts the circuit board. The plurality of standoff passive devices can include a capacitor, a resistor, or an inductor.

Figure 1:
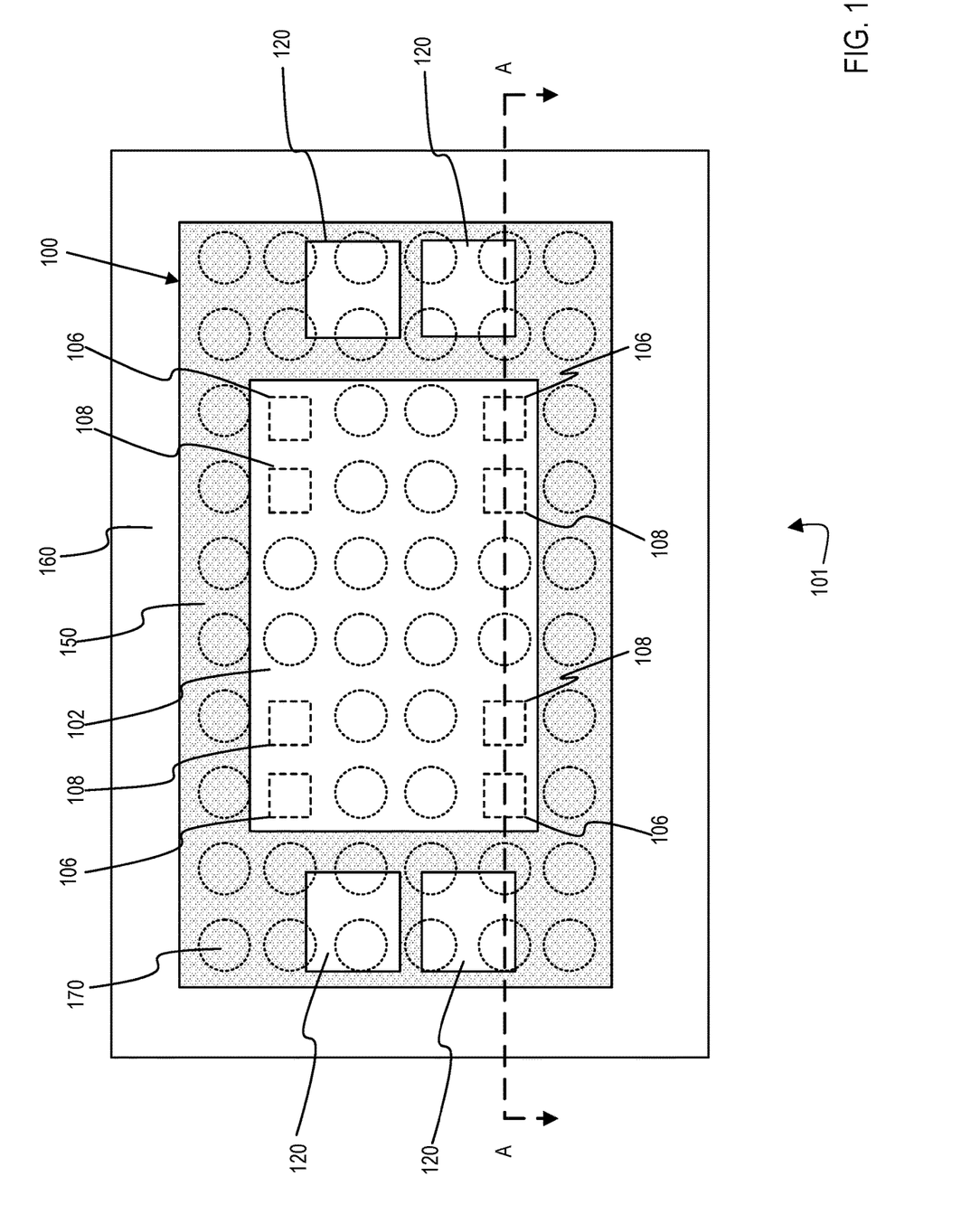
FIG. 1 sets forth a block diagram of an example semiconductor module implementing a semiconductor package assembly using a passive device as a standoff according to some implementations of the present disclosure.

Implementations in accordance with the present disclosure will be described in further detail beginning with FIG. 1. Like reference numerals refer to like elements throughout the specification and drawings. FIG. 1 sets forth a block diagram of an example semiconductor package assembly 100 in accordance with some implementations of the present disclosure. Implementations of the semiconductor package assembly 100 can be useful in high performance applications, such as a personal computer, a notebook, a tablet, a smart phone, a storage data center, or in applications involving large scale databases and/or analytics, such as finance, life sciences, and/or artificial intelligence. Many other applications are also possible. Additionally, the example semiconductor package assembly can be assembled as described herein in a manner that includes a dummy passive device that functions as a standoff component to prevent the bridging of solder structures and to prevent other operable passive devices from contacting a circuit board or other platform on which the semiconductor package assembly 100 is mounted.

The example semiconductor package assembly 100 depicted in FIG. 1 includes a semiconductor chip 102. The semiconductor chip 102 can be any of a variety of integrated circuits. A non-exhaustive list of examples includes a microprocessor, a central processing unit (CPU), a graphics processing unit (GPU), an accelerated processing unit (APU) that combines aspects of both, an application specific integrated circuit, and the like. The embodiment disclosed herein is not reliant on particular functionalities of the semiconductor chip 102. The semiconductor chip 102 is mounted on a substrate 150 for supplying power and ground to the components of the semiconductor package assembly 100 and for providing input and output ('I/O') pathways to external components such as a printed circuit board 160. Solder structures 170 are attached to a bottom surface (or land-side surface) of the substrate 150 for mounting the semiconductor package assembly 100 on a circuit platform such as the printed circuit board 160.

Passive devices 106, 108 are coupled to a top surface (or chip-side surface) and the bottom surface of the substrate 150. The passive devices 106, 108 can be capacitors, resistors, inductors, or combinations thereof. Some passive devices (i.e., passive devices 106) are provided to improve the electrical performance of the semiconductor chip 102. For example, a capacitor can be provided for voltage stabilization or decoupling, or resistors can be provided to improve electrical load characteristics or circuit protection. Other passive devices (i.e., passive devices 108) are not provided to improve the electrical performance of the semiconductor chip 102 or other components of the semiconductor package assembly. The passive devices 108 can be characterized as 'dummy' passive devices in that they are electrically isolated from the semiconductor chip. Rather, passive devices 108 are provided as standoff structures useful in maintaining a minimum distance between the substrate 150 and the circuit board 160 to prevent the bridging of solder structures 170 during a solder reflow process. The passive devices 106, 108 can be attached in the same fabrication process step, thus eliminating the need for a separate process step to attach a standoff structure to the semiconductor package assembly 100 or to the printed circuit board 160.

In some implementations, semiconductor package assembly 100 can also include peripheral devices 120. Examples of peripheral devices 120 can include high bandwidth memory (HBM) devices or other stacked memory devices that ca be co-packaged with the semiconductor chip 102.

Figure 2:
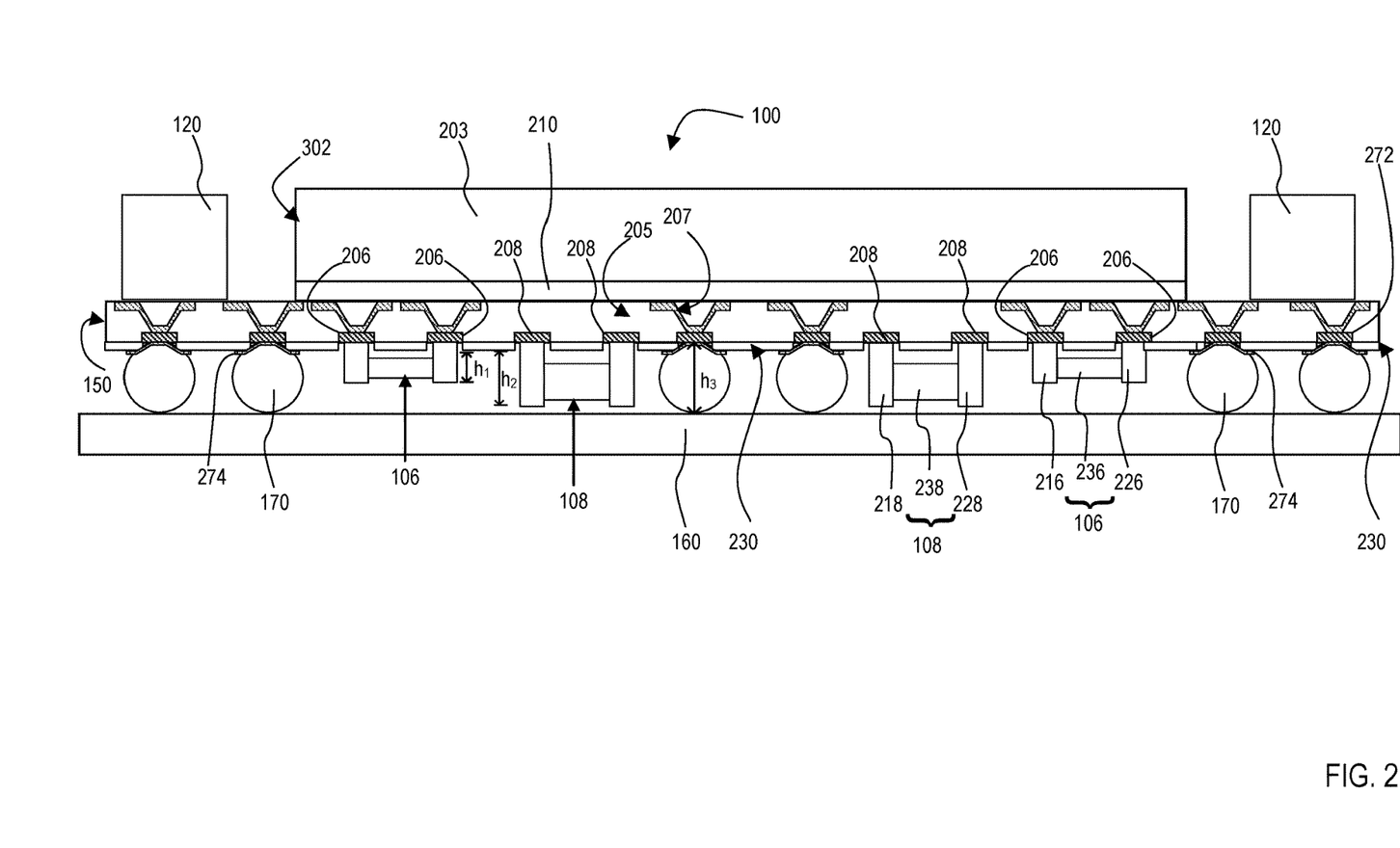
FIG. 2 sets forth a block diagram that is a cross section view of the example semiconductor module implementing a semiconductor package assembly using a passive device as a standoff according to some implementations of the present disclosure.

For further explanation, FIG. 2 depicts a cross section view of the example semiconductor package assembly 100 of FIG. 1 in accordance with some implementations. The cross section is taken along line A-A in FIG. 1. In the example of FIG. 2, the semiconductor chip 102 includes a die interface 210 such as a die-level build-up structure such as a back end of line layer created during die fabrication or a redistribution layer fabricated after die fabrication. The die interface 210 includes layers of metallization and inter-level dielectric layers, as well as conductor structures such as vias, traces, and pads. The die interface 210 includes a number of metal interconnects (e.g., micro-bumps or bonding pads) that are bonded to counterpart bond pads disposed on the top surface of the substrate 150 for conveying power, ground, input signals, and output signals.

The semiconductor chip 102 also includes a body 203 constructed of, for example, silicon, germanium, or other types of semiconductor materials. The body 203 includes various functional logic blocks, logic gates, clocks, buses, and other elements formed in the body as will be appreciated by those of skill in the art. In some examples, the semiconductor chip 102 is constructed with a physical layer or 'PHY' region, which has various internal and external conductor structures dedicated to the transmission of chip-to-chip signals, and a non-PHY region, which has conductor structures that are tailored more to the conveyance of power and ground and/or chip-to-substrate signals.

In some examples, the substrate 150 includes one or more dielectric layers 205, and one or more circuit layers of conductive structures 207. The material of the dielectric layer can include, but is not limited to, resin such as epoxy, glass fiber, semiconductor, ceramic, glass, plastic, or other suitable materials. The circuit layer(s) can include a redistribution layer (RDL) structure composed of vias, traces, pads, and other conductive structures. The circuit layer(s) can be disposed in the dielectric layer(s), on the dielectric layer(s) or between adjacent dielectric layer(s). The material of the circuit layer(s) can include, but is not limited to, metal such as copper or the like.

In some implementations, the substrate 150 includes conductive pads 206 on the bottom surface of the substrate to which the passive devices 106 are coupled electrically and mechanically coupled. For example, the passive devices 106 can be coupled to the conductive pads 206 by solder material such as solder paste. The passive devices 106 contribute to the performance of the semiconductor chip and thus are regarded as operable passive devices. As depicted in FIG. 2, the passive devices 106 are capacitors. In this example, one electrode 216 of the capacitor is bonded to one conductive pad 206 while another electrode 226 is bonded to another conductive pad 206, with dielectric material 236 formed between the electrodes 216, 226. The passive device 106, in the form of a capacitor, can be placed within an electrical pathway between a power source and the semiconductor chip 102 to improve the performance of the semiconductor chip 102 (e.g., by filtering noise or smoothing voltage). However, the passive devices 106 are not limited to capacitors, and those of skill in the art will recognize that passive devices 106 can be other passive components such as resistors and inductors. The passive devices 106 are surface-mount devices. In some variations, the passive devices 106 are low-profile surface mount devices. In the example depicted, the height (or standoff distance from the substrate 150) of any of the passive devices 106 has a maximum value of $h_1$.

In some implementations, the substrate 150 also includes conductive pads 208 on the bottom surface of the substrate to which the passive devices 108 are electrically and mechanically coupled. The passive devices 108 are coupled to the conductive pads 208 by solder material such as solder paste. The passive devices 108 are not coupled to the electrical circuitry of the semiconductor chip and thus are regarded as inoperable passive devices (or 'dummy' passive devices). The passive devices 108 function as standoff components to establish a minimum distance between the substrate and a surface on which the substrate is mounted. Although the passive device 108 are inoperable and are not coupled to the electrical circuitry of the semiconductor chip, it is noted that the passive device 108 can be the same devices as passive device 106. For example, the passive devices 108 are capacitors. In this example, one electrode 218 of the capacitor is bonded to one conductive pad 208 while another electrode 228 is bonded to another conductive pad 208, with dielectric material 238 formed between the electrodes 218, 228. The conductive pads 208, however, electrically isolate the passive device 108 from the active electrical circuitry of the semiconductor chip 102. In some variations, the conductive pads 208 are floating pads that are not electrically coupled to any other conductive structure of the substrate. Thus, the passive devices 108 are not placed within an electrical pathway to or from the semiconductor chip. In other variations, the conductive pads 208 are coupled to ground. In such examples, the passive devices 108 can be grounded to prevent electromagnetic characteristics of the capacitors (or some other implementation of passive device) from imparting an effect on the electrical performance of the semiconductor chip 102. The passive devices 108 are surface mount devices. As depicted, the height (or standoff distance from the substrate 150) of any of the passive devices 108 has a maximum value $h_2$ and a minimum value that is greater than $h_1$.

The substrate 150 also includes conductive pads 272 on the bottom surface of the substrate to which the solder structures 170 are electrically coupled. The conductive pads 272 implement an electrical pathway from the circuit board 160 (through the solder structures 170) to the semiconductor chip 102 (through conductive structures formed in the substrate 150 such as RDL structures).

In the example of FIG. 2, the semiconductor package assembly 100 also includes a solder mask 230 applied to the bottom surface of the substrate 150. Apertures in the solder mask 230 expose the conductive pads 206, 208, 272 on the bottom surface of the substrate. In some examples, an under-bump metallization layer 274 is applied over conductive pads 272 to assist in bonding the solder structures 170 to the conductive pads 272.

In some implementations, when the semiconductor package assembly 100 is mounted on the printed circuit board 160, a solder process (e.g., solder reflow, infrared) is performed to bond the semiconductor package assembly 100 to the printed circuit board 160. As previously explained, during this process there is a risk of solder structure bridging. To mitigate this risk, the passive devices 108 act as standoff components to maintain a distance between the substrate 150 and the circuit board 160. Because the passive devices 108 are electrically isolated from the semiconductor chip 102 and other package components, it is of no consequence if the passive devices 108 comes into physical contact with the printed circuit board 160. Accordingly, the height $h_2$ of the passive devices 108 is selected to be less than the height of the solder structures 170 to permit compression of the solder structures 170 for forming the bond, while limiting compression of the solder structures 170 such that bridging can occur. The height $h_2$ of the passive devices 108 can be selected based on the pitch of the solder structures 170, the material of the solder structures 170, the diameter of the solder structures 170, and the amount of compression desirable for forming the bond. For example, based on the pitch of spherical solder structures, there can be conditions in which 50% compression of the solder structures 170 would result in bridging. In such a scenario, the height $h_2$ of the passive devices 108 is selected to be more than 50% of the height/diameter of the solder structures. In this scenario, the height $h_2$ of the passive devices 108 is selected to be less than the uncompressed height/diameter $h_3$ of the solder structures 170 by a factor that will permit sufficient compression for bonding.

For further explanation, FIGS. 3-7 set forth an example process flow for fabricating a semiconductor device, such as the example implementation of a semiconductor device 101 depicted in FIGS. 1 and 2, according to various implementations. Beginning with FIG. 3, a fabricated semiconductor package 300 is provided. The semiconductor package includes a semiconductor chip 302 and a substrate 350. Like the semiconductor chip 102 of FIGS. 1 and 2, the semiconductor chip 302 includes a body 303. The body 303 includes logic, gates, clocks, and the like, and an interface 310 which includes layers of metal and dielectric material. The interface 310 of the semiconductor chip is bonded to a top surface of the substrate 350. A mold material 309 such as epoxy resin encapsulates the semiconductor chip 302. The substrate 350 includes one or more layers of dielectric material 355 and one or more layers of metal. The layers of metal form conductive structures 357 such as traces, pads, and vias dispersed throughout the dielectric material.

Figure 3:
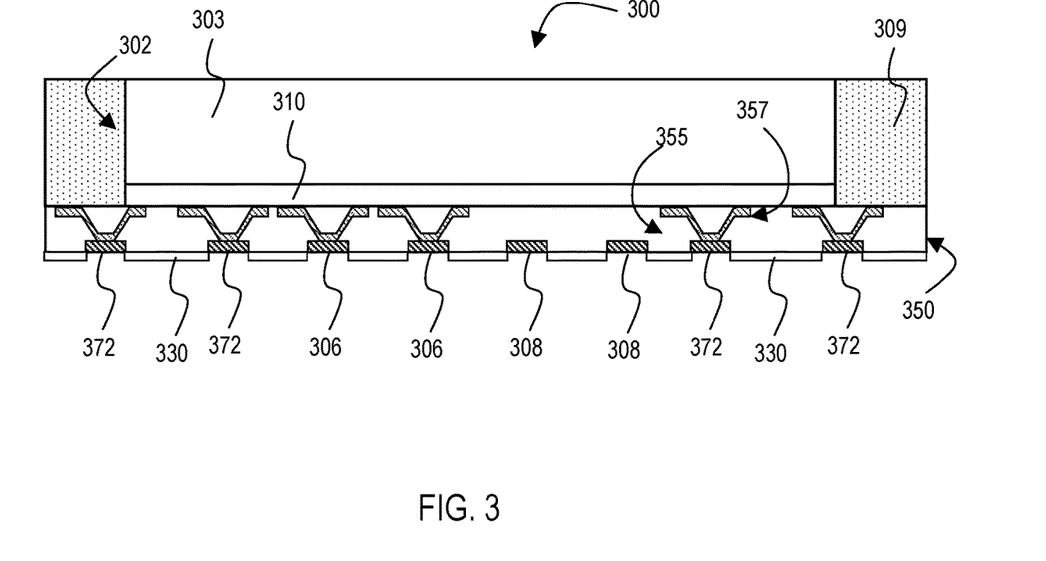
FIG. 3 is a portion of an example process flow for fabricating a semiconductor package assembly using a passive device as a standoff according to some implementations.

Conductive pads 306, 308, 372 are formed on a bottom surface of the substrate 350. Conductive pads 306, 372 electrically interface with other conductive structures 357 in the substrate 350 such that conductive pads 306, 372 are operable to provide an electrical pathway between the bottom surface of the substrate 350 to the top surface of the substrate 350 and to the semiconductor chip 302. Conductive pads 308, by contrast, are electrically isolated from conductive structures 357 in the substrate that provide an electrical pathway to the semiconductor chip 302 or other components in the semiconductor package 300. In some variations, conductive pads 308 are floating pads that are not electrically coupled to anything. In other variations, conductive pads 308 are connected to a ground port, pad, or trace. In some examples, a solder mask 330 is provided on the bottom surface of the substrate 350. The solder mask 330 includes apertures to expose the conductive pads 306, 308, 372.

Figure 4:
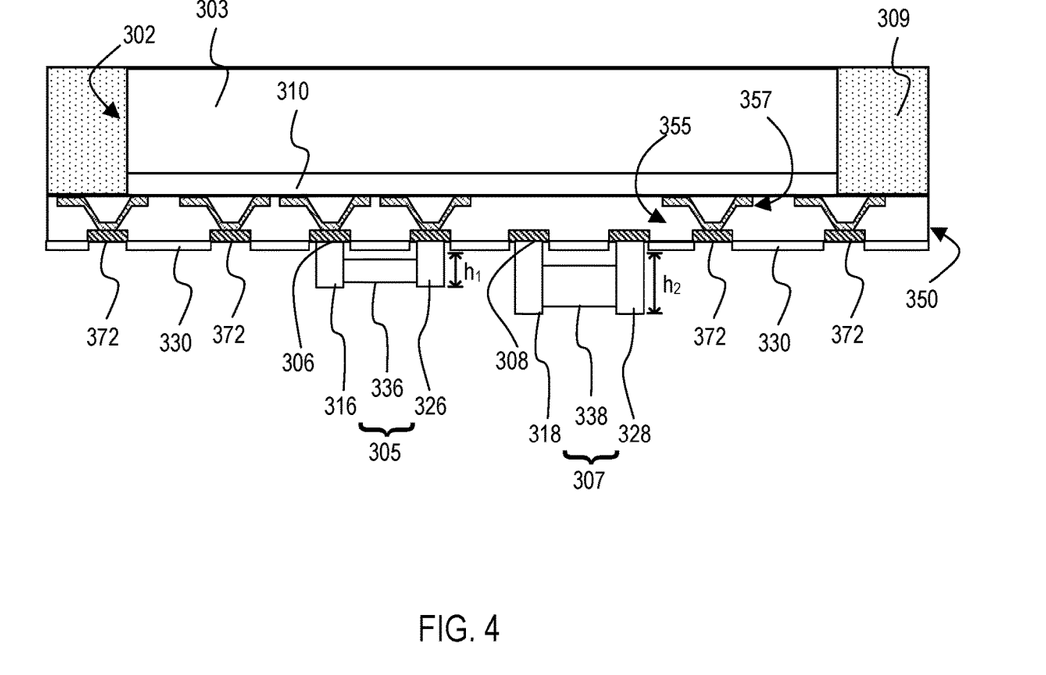
FIG. 4 is another portion of the example process flow for fabricating a semiconductor package assembly using a passive device as a standoff according to some implementations.

Moving to FIG. 4, passive devices 305, 307 are placed on the bottom surface of the substrate 350 at the exposed conductive pads 306, 308. Operable passive devices 305 are placed on the conductive pads 306 to electrically couple to the semiconductor chip 302 to improve the performance of the semiconductor chip. As depicted in FIG. 4, the operable passive devices 305 can be capacitors that include electrodes 316, 326 in electrical contact with the conductive pads 306. A dielectric material 336 is disposed between the electrodes 316, 326.

Standoff passive devices 307 are placed on the conductive pads 308 in electrical isolation from the semiconductor chip 302. As depicted in FIG. 4, the standoff passive devices 307 can be capacitors, resistors, inductors, diodes, and the like. Such devices 307 can include electrodes 318, 328 in electrical contact with the conductive pads 308. A dielectric material 338 is disposed between the electrodes 318, 328.

The standoff passive devices 307 are selected to have a standoff height $h_2$, relative to the solder mask 330 or bottom surface of the substrate 350. The standoff height $h_2$ is greater than the standoff height $h_1$ of the operable passive devices 305. The operable passive devices 305 and the standoff passive devices 307 are placed in the same process step by, for example, a pick-and-place technique. In some examples, solder paste is used to place the passive devices 305, 307 on the conductive pads 306, 308. The standoff passive devices could operate if not electrically isolated from other components by being connected to isolated conductive pads 308.

Figure 5:
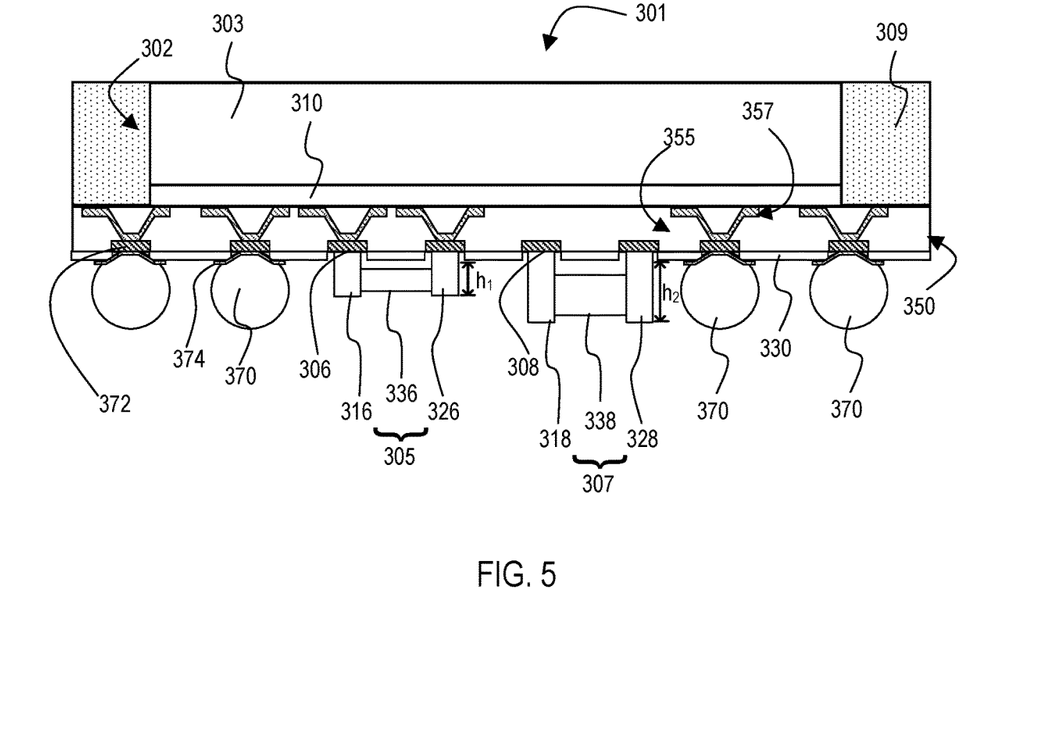
FIG. 5 is another portion of the example process flow for fabricating a semiconductor package assembly using a passive device as a standoff according to some implementations.

Moving to FIG. 5, solder structures 370 (e.g., C4 solder balls) are placed on the bottom surface of the substrate 350 at the exposed conductive pads 372. In some examples, an under-bump metallization layer 374 is fabricated on the conductive pads and portions of the solder mask 330 surrounding exposed conductive pad 372 to facilitate attachment of the solder structures 370. The solder structures 370 have a diameter $h_3$ (or standoff height from the bottom surface of the substrate 350) that is greater than the height $h_2$ of the standoff passive devices 307.

Figure 6:
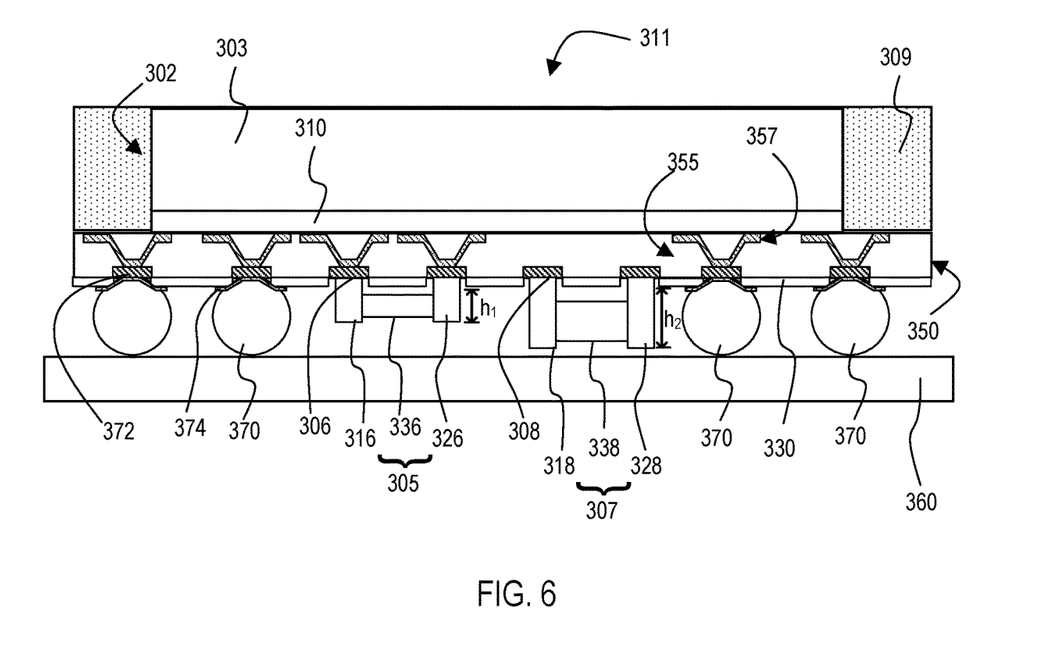
FIG. 6 is another portion of the example process flow for fabricating a semiconductor package assembly using a passive device as a standoff according to some implementations.

Moving to FIG. 6, the semiconductor package assembly 301 from FIG. 5 is placed on a circuit board 360 or other component surface. The semiconductor package assembly 301 is placed such that the array of solder structures 370 on the bottom surface of the substrate 350 align with conductive pads (not shown) on the surface of the circuit board 360. Upon placement of the semiconductor package assembly 301, the array of solder structures 370 contacts the surface of the circuit board 360. As previously mentioned, the diameter/height $h_3$ of the solder structure 370 is greater than the height $h_2$ of the standoff passive devices 307 such that the passive device 307 do not contact the circuit board 360.

Figure 7:
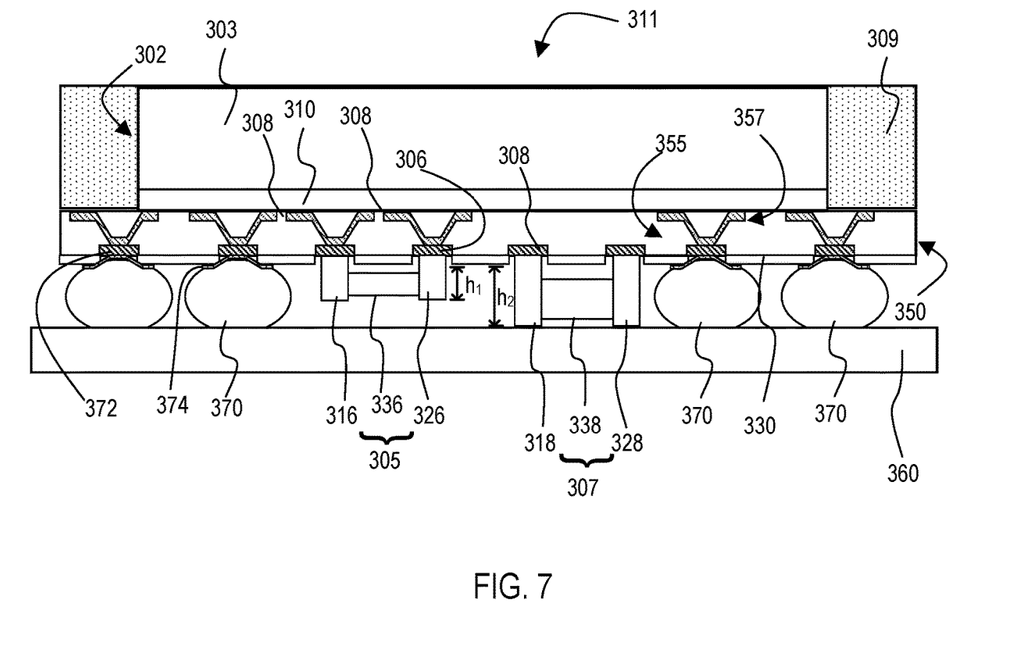
FIG. 7 is another portion of the example process flow for fabricating a semiconductor package assembly using a passive device as a standoff according to some implementations.

Moving to FIG. 7, semiconductor device 311 from FIG. 6 undergoes a solder melt process such as solder reflow through baking or infrared heating. During this process, in some implementations, solder paste applied to the passive devices 305, 307 melts and then solidifies to bond the passive devices 305, 307 to the conductive pads 306, 308. In these implementations, the solder structures also melt and then solidify, thereby bonding to the conductive pads 372 (or under-bump metallization 374, if present) and to the circuit board 360. During the melt process, the solder structures 370 compress under the weight of the semiconductor package 300. In some cases, the solder structures 370 compress to the extent that the distance between the semiconductor package and the circuit board reduces to the height $h_2$ of the standoff passive devices 307. The standoff passive devices 307 prevent any further reduction in the distance between semiconductor package and the circuit board and thus prevent further compression of the solder structures 370. In this way, the bridging of adjacent solder structures 370 is prevented.

Figure 8:
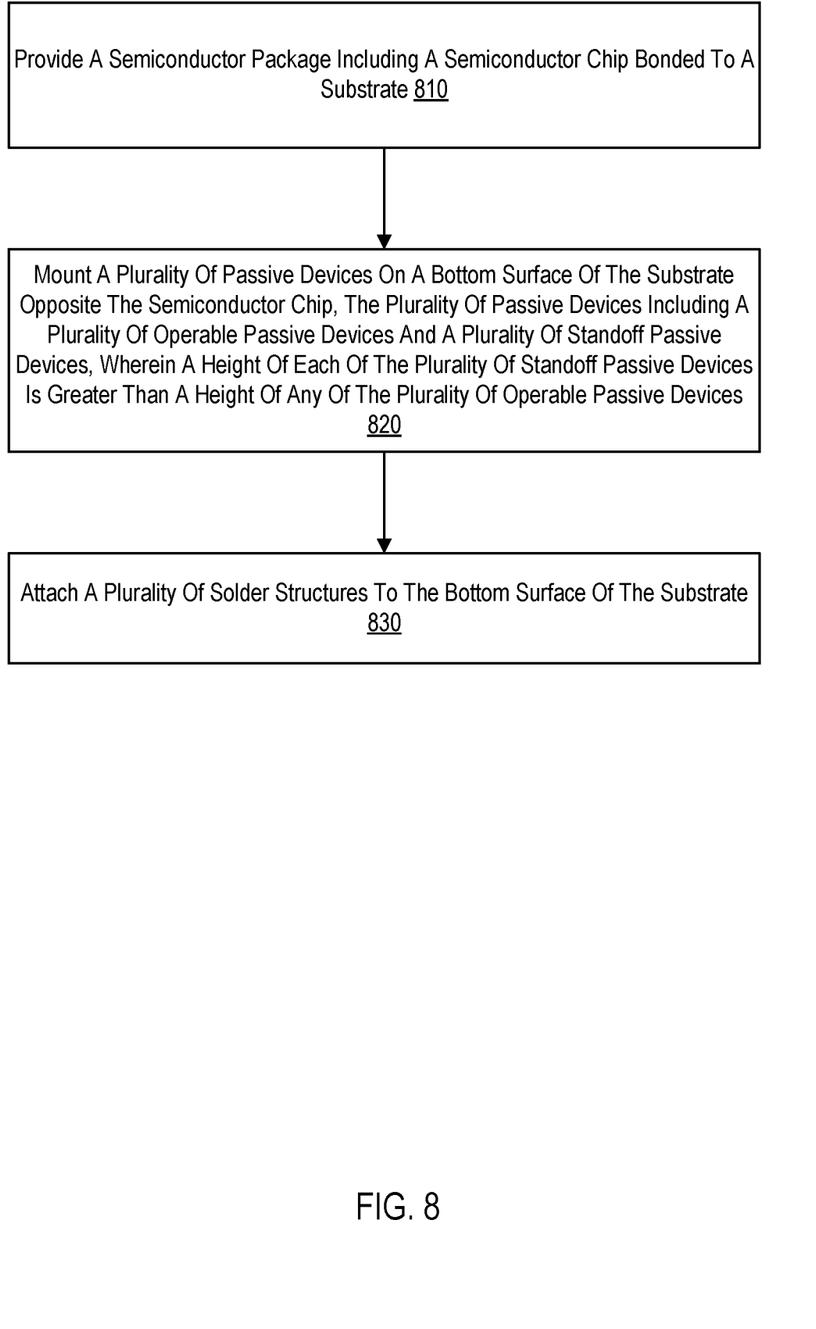
FIG. 8 is a flowchart of an example method of fabricating a semiconductor package assembly using a passive device as a standoff according to some implementations.

For further explanation, FIG. 8 sets forth a flow chart illustrating an example method of fabricating a semiconductor package assembly using a passive device as a standoff according to some implementations of the present disclosure. The example method of FIG. 8 includes providing 810 a semiconductor package including a semiconductor chip bonded to a substrate. The substrate includes a plurality of conductive pads formed on the bottom surface of the substrate for implementing electrical pathways between the semiconductor chip and other components. The conductive pads are suited for electrical coupling to, for example, solder structures and passive devices on the bottom surface of the substrate of the semiconductor package. Providing 810 the semiconductor package can be carried out as described above and depicted in FIG. 3.

The method of FIG. 3 also includes mounting 820 a plurality of passive devices on a bottom surface of the substrate opposite the semiconductor chip. The plurality of passive devices includes a number of operable passive devices and a number of standoff passive devices. A height of each of the standoff passive devices is greater than a height of any of the operable passive devices. Mounting 820 the plurality of passive device is carried out by placing operable passive devices and standoff passive devices on conductive pads formed on the bottom surface of the substrate. The passive devices can be adhered using, for example, solder paste. In some implementations, both the operable passive devices and the standoff passive devices are placed in the same process step. For example, a pick-and-place process can be employed to place the operable passive devices and the standoff passive devices in the same process step. The operable passive devices are electrically coupled to the semiconductor chip to improve the performance of the semiconductor chip. The standoff passive devices are not electrically coupled to the semiconductor chip and neither improve nor impede the electrical performance of the semiconductor chip. The standoff passive devices are selected to have a standoff height $h_2$, relative to the bottom surface of the substrate or solder mask, that is greater than the standoff height $h_1$ of the operable passive devices. In other words, the standoff passive devices are taller in a direction perpendicular to the substrate that the operable passive devices. Mounting 820 the passive devices on the bottom surface of the substrate is described above in greater detail with respect to FIG. 4.

The method of FIG. 8 also includes attaching 830 a plurality of solder structures to the bottom surface of the substrate. Such solder structures can be attached in the form of solder balls to the bottom of the substrate such that the solder structures are electrically coupled to conductive pads. In some variations, an under-bump metal layer is applied to the conductive pads and surrounding portion of the solder mask prior to attaching the solder structures. The standoff height $h_2$ of the standoff passive devices is selected to be less than the diameter of the solder structures. Attaching 830 the solder structures to the bottom surface of the substrate is described above in greater detail with respect to FIG. 5.

Figure 9:
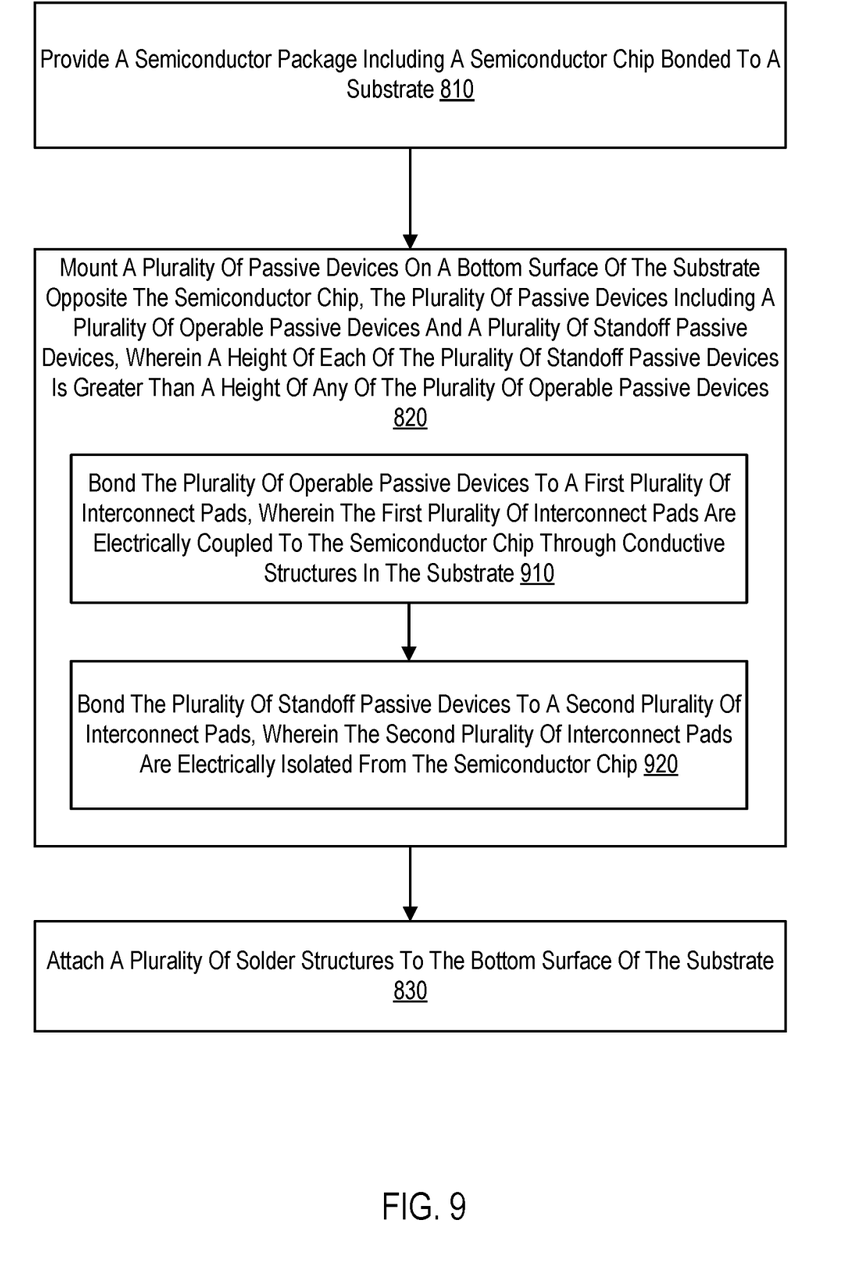
FIG. 9 is a flowchart of another example method of fabricating a semiconductor package assembly using a passive device as a standoff according to some implementations.

For further explanation, FIG. 9 sets forth a flow chart illustrating a more detailed example method of fabricating a semiconductor package assembly using a passive device as a standoff according to some implementations of the present disclosure. The example method of FIG. 9 is similar to that of FIG. 8, except that mounting 820 the plurality of passive devices on the bottom surface of the substrate includes bonding 910 the plurality of operable passive devices to a first plurality of interconnect pads. The first plurality of interconnect pads are electrically coupled to the semiconductor chip through conductive structures in the substrate. In some implementations, bonding 910 the operable passive devices to the first interconnect pads is carried out by bonding the devices to operable conductive pads that provide an electrical pathway to the semiconductor chip. The bonding 910 processing is described above in greater detail with respect to FIG. 4.

Figure 10:
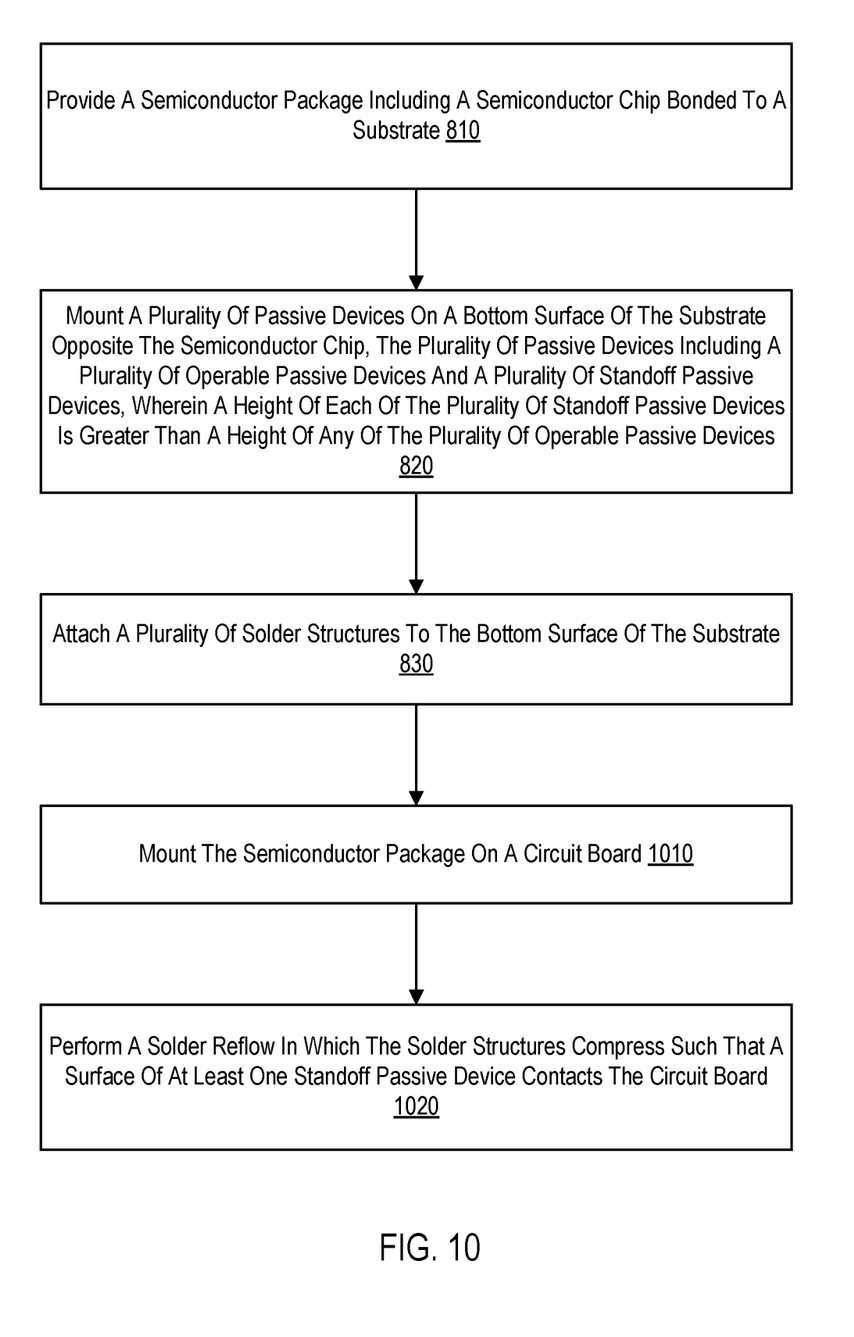
FIG. 10 is a flowchart of another example method of fabricating a semiconductor package assembly using a passive device as a standoff according to some implementations.

The example method of FIG. 9 also includes bonding 920 the plurality of standoff passive devices to a second plurality of interconnect pads. The second plurality of interconnect pads are electrically isolated from the semiconductor chip. That is, the standoff passive devices are bonded to non-operative conductive pads that do not provide an electrical pathway to the semiconductor chip. In some variations, the non-operative conductive pads are floating conductive pads that are not connected to any other conductive structure in the substrate. In other variations, the non-operative conductive pads are connected to ground. The process for bonding 920 the standoff passive devices to interconnect pads is described above with respect to For further explanation, FIG. 10 sets forth a flow chart illustrating another variation of fabricating a semiconductor package assembly using a passive device as a standoff according to some implementations of the present disclosure. The method of FIG. 10 is similar to that of FIG. 8, except the method of FIG. 10 also includes mounting 1010 the semiconductor package on a circuit board. In some implementations, mounting 1010 the semiconductor package on the circuit board is carried out by first placing the semiconductor package assembly. The semiconductor package assembly is placed such that an array of solder structures on the bottom surface of the substrate aligns with conductive pads on the surface of the circuit board. Upon placement of the semiconductor package assembly, the array of solder structures contacts the surface of the circuit board. Mounting 1010 the semiconductor package on a circuit board is described above in greater detail with respect to FIG. 5.

The example method of FIG. 10 also includes performing 1020 a solder reflow in which the solder structures compress. The compression causes a surface of at least one standoff passive device to contact the circuit board. In some implementations, performing 1020 the solder reflow is carried out by a solder melt process through baking or infrared heating. After the solder reflow process, the standoff passive devices can be in contact with the circuit board, thus preventing further compression of the solder structures and solder bridging. The solder reflow process is described above in greater detail with respect to FIG. 5.

In view of the foregoing, it will be appreciated that a number of advantages are realized through implementations of the present disclosure. The present disclosure provides a non-operable or 'dummy' passive device as a standoff between a package substrate and a circuit board. The height of the passive device is selected to prevent the bridging of solder structures interconnecting the package to the circuit board resulting from compression of the solder structures. During a solder reflow process, the standoff passive device maintains a distance between the substrate and the circuit board such that warping is prevented and over-compression of the solder structures is inhibited, thereby mitigating the risk of solder bridging. Further, the passive device can be non-operable and electrically isolated from the semiconductor chip in the package to prevent electrical interference. By using a passive device as a standoff component, the standoff can be attached in the same process step as the other passive devices, thus eliminating an extra process step for attaching a standoff component.

It will be understood from the foregoing description that modifications and changes can be made in various implementations of the present disclosure. The descriptions in this specification are for purposes of illustration only and are not to be construed in a limiting sense. The scope of the present disclosure is limited only by the language of the following claims.

What is claimed is:

1. A semiconductor package assembly comprising:
   a semiconductor package including a semiconductor chip bonded to a substrate;

a plurality of passive devices mounted on a bottom surface of the substrate opposite the semiconductor chip, the plurality of passive devices including a plurality of operable passive devices and a plurality of standoff passive devices, wherein a height of each of the plurality of standoff passive devices is greater than a height of any of the plurality of operable passive devices; and a plurality of solder structures attached to the bottom surface of the substrate.

2. The assembly of claim 1, wherein the height of each of the plurality of standoff passive devices is less than a height of the plurality of solder structures.

3. The assembly of claim 1, wherein the substrate includes a first plurality of interconnect pads electrically coupled to the semiconductor chip through conductive structures in the substrate, the plurality of operable passive devices being bonded to the first plurality of interconnect pads; and wherein the substrate includes a second plurality of interconnect pads electrically isolated from the semiconductor chip, the plurality of standoff passive devices being bonded to the second plurality of interconnect pads.

4. The assembly of claim 3, wherein the second plurality of interconnect pads are not electrically coupled to any conductive structures in the substrate.

5. The assembly of claim 3, wherein the second plurality of interconnect pads are coupled to ground.

6. The assembly of claim 1, wherein the plurality of standoff passive devices includes at least one of a capacitor, a resistor, and an inductor.

7. An apparatus comprising:
a circuit board;
a semiconductor package coupled to the circuit board by a plurality of solder structures, the semiconductor package including a semiconductor chip bonded to a substrate; and
a plurality of passive devices mounted on a bottom surface of the substrate between the substrate and the circuit board, the plurality of passive devices including a plurality of operable passive devices and a plurality of standoff passive devices, wherein a height of each of the plurality of standoff passive devices is greater than a height of any of the plurality of operable passive devices.

8. The apparatus of claim 7, wherein the height of each of the plurality of standoff passive devices is less than a height of the plurality of solder structures.

9. The apparatus of claim 7, wherein the substrate includes a first plurality of interconnect pads electrically coupled to the semiconductor chip through conductive structures in the substrate, the plurality of operable passive devices being bonded to the first plurality of interconnect pads; and wherein the substrate includes a second plurality of interconnect pads electrically isolated from the semiconductor chip, the plurality of standoff passive devices being bonded to the second plurality of interconnect pads.

10. The apparatus of claim 9, wherein the second plurality of interconnect pads are not electrically coupled to any conductive structures in the substrate.

11. The apparatus of claim 9, wherein the second plurality of interconnect pads are coupled to ground.

12. The apparatus of claim 9, wherein at least one of the plurality of standoff passive devices contacts the circuit board.

13. The apparatus of claim 7, wherein the plurality of standoff passive devices includes at least one of a capacitor, a resistor, and an inductor.

14. The assembly of claim 1, wherein the semiconductor package is mounted on a circuit board.

15. The assembly of claim 14, wherein at least one of the plurality of standoff passive devices contacts the circuit board.

16. The assembly of claim 3, wherein a solder paste is used for bonding the plurality of operable passive devices to the first plurality of interconnect pads and for bonding the plurality of standoff passive devices to the second plurality of interconnect pads.

17. The apparatus of claim 9, wherein a solder paste is used for bonding the plurality of operable passive devices to the first plurality of interconnect pads and for bonding the plurality of standoff passive devices to the second plurality of interconnect pads.

18. The assembly of claim 3, wherein the conductive structures in the substrate comprise multiple redistribution layer (RDL) structures.

19. The apparatus of claim 9, wherein the conductive structures in the substrate comprise multiple redistribution layer (RDL) structures.

* * * * *